(12) United States Patent
Stegers (10) Patent No.: US 6,445,331 B1
(45) Date of Patent: Sep. 3, 2002

(54) APPARATUS AND METHOD FOR COMMON-MODE REGULATION IN A SWITCHED CAPACITOR CIRCUIT

(75) Inventor: Marc Gerardus Maria Stegers, Delft (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/930,675

(22) Filed: Aug. 14, 2001

(51) Int. Cl.[7] .......................... H03M 1/12; H03M 3/00; H03K 17/00; H03B 1/00
(52) U.S. Cl. .................... 341/172; 341/143; 327/96; 327/337; 327/554
(58) Field of Search .................................. 341/172, 143

(56) References Cited

U.S. PATENT DOCUMENTS 5,057,839 A * 10/1991 Koch ........................ 341/143
5,617,093 A * 4/1997 Klein ........................ 341/172
5,691,720 A * 11/1997 Wang et al. ................ 341/143

* cited by examiner

Primary Examiner—Howard L. Williams
(74) Attorney, Agent, or Firm—Brett A. Hertzberg; Merchant & Gould P.C.

(57) ABSTRACT

An apparatus and method for an improved integrator provides for a regulated common-mode voltage. The improved integrator is arranged as a switched capacitor circuit that includes a differential amplifier. The common-mode input voltage of the differential amplifier is regulated by proper arrangement of the switched capacitor circuit. By regulating the common-mode input voltage, the performance of the differential amplifier is improved. Since the common-mode input voltage is regulated, it is possible to operate the improved integrator at power supply levels below 2V. The improved integrator operates with three single-ended reference signals such that the integrator design is simplified and overall costs are reduced. Capacitor ratios may be adjusted to scale the input common-mode voltage of the differential amplifier. The improved integrator may be arranged as a delayed integrator or a non-delayed integrator by changing the control signals on the switches. The improved integrator may be used in a ΔΣ-modulator.

23 Claims, 6 Drawing Sheets

APPARATUS AND METHOD FOR COMMON-MODE REGULATION IN A SWITCHED CAPACITOR CIRCUIT

FIELD OF THE INVENTION

The present invention relates generally to switched capacitor circuits. More particularly, the present invention relates to an apparatus and method that reduces the requirements and number of voltage references that are necessary for proper operation in a switched capacitor circuit while maintaining an optimized common-mode input voltage.

BACKGROUND OF THE INVENTION

Figure 6:
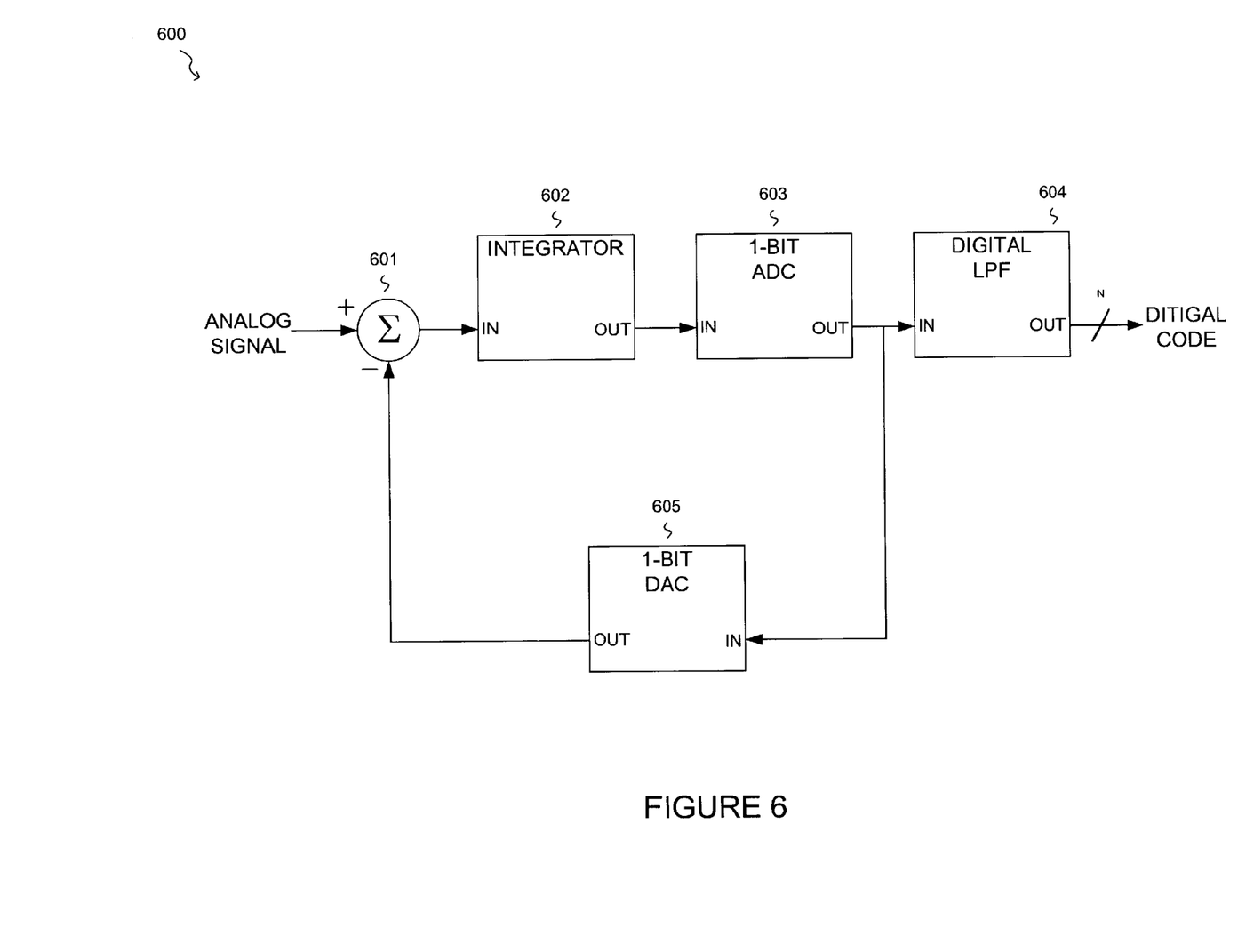
FIG. 6 is a block diagram of a first-order ΔΣ-modulator system.

A one-bit over-sampling analog-to-digital converter (600) is depicted in FIG. 6. This type of analog-to-digital converter (ADC) is often referred to as a first order delta-signal ($\Delta\Sigma$) modulator. As shown in the figure, the first order $\Delta\Sigma$-modulator (600) includes a summer (601), an integrator (602), a 1-bit ADC (603) a digital low pass filter (604), and a 1-bit digital-to-analog converter (605). The first order $\Delta\Sigma$-modulator (600) receives an analog signal and produces an N-bit digital code output.

In operation, an analog signal and an output of 1-bit digital-to-analog converter (DAC) 605 are fed into summer 601. The summer (601) provides an output that corresponds to the difference between the analog input signal and the output of DAC 605. The integrator (602) provides an integration signal in response the difference signal. The 1-bit ADC (603) produces a digital bit by converting by comparing the integration signal to a predetermined threshold level (i.e., mid-supply level). This digital bit is fed into the 1-bit DAC, which produces an analog voltage that corresponds to one of two voltages (i.e., +VREF and -VREF). Digital low pass filter (LPF) 604 receives the digital bit from the 1-bit ADC (603) and produces an N-bit digital code output.

SUMMARY OF THE INVENTION

The present invention is directed to switched capacitor circuits. More particularly, the present invention relates to an apparatus and method for a switched capacitor integrator that includes common-mode input voltage regulation.

Briefly described below is an apparatus and method for an improved integrator that provides for a regulated common-mode voltage. The improved integrator is arranged as a switched capacitor circuit that includes a differential amplifier. The common-mode input voltage of the differential amplifier is regulated by proper arrangement of the switched capacitor circuit. By regulating the common-mode input voltage, the performance of the differential amplifier is improved. Since the common-mode input voltage is regulated, it is possible to operate the improved integrator at power supply levels below 2V. The improved integrator operates with three single-ended reference signals such that the integrator design is simplified and overall costs are reduced. Capacitor ratios may be adjusted to scale the input common-mode voltage of the differential amplifier. The improved integrator may be arranged as a delayed integrator or a non-delayed integrator by changing the control signals on the switches. The improved integrator may be used in a $\Delta\Sigma$-modulator.

An apparatus for controlling a common-mode input voltage for a differential amplifier, where the differential amplifier includes a first input terminal and a second input terminal is also described below. The apparatus includes a first and second reference capacitance circuit, and a first and second input capacitance circuit. First and second switching circuits are arranged to initialize the first and second reference capacitance circuits, respectively, to a first potential when the apparatus is in a sample mode. Third and fourth switching circuit are arranged to initialize the first and second input capacitance circuits, respectively, to a second potential when the apparatus is in the sample mode. A fifth switching circuit is arranged to couple a first reference signal to the first reference capacitance circuit when the apparatus is in a hold mode. A sixth switching circuit is arranged to couple a second reference signal to the second reference capacitance circuit when the apparatus is in the hold mode. A seventh switching circuit is arranged to couple the first reference capacitance circuit and the first input capacitance circuit to the first input of the differential amplifier when the apparatus is in the hold mode. An eighth switching circuit is arranged to couple the second reference capacitance circuit and the second input capacitance circuit to the second input of the differential amplifier when the apparatus is in the hold mode. The common-mode input voltage of the differential amplifier is determined by at least the first reference signal, the second reference signal, and a third reference signal. The first potential is determined by two of the first, second, and third reference signals, while the second potential is determined by at least one of the first, second, and third reference signals.

In one example, a method for controlling a common-mode input voltage for a differential amplifier in a switched capacitor circuit is described below. The method includes initializing first and second reference capacitors to a first potential during a sampling mode, coupling one of a first reference signal and a second reference signal to the first capacitor during a hold mode, coupling another of the first reference signal and a second reference signal to the second capacitor during the hold mode, initializing first and second input capacitors to a second potential during the sampling mode, coupling the first reference capacitor and the first input capacitor to a first input of the differential amplifier during the hold mode, coupling the second reference capacitor and the second input capacitor to a second input of the differential amplifier during the hold mode, redistributing charge stored on the first reference capacitor and the first input capacitor during the hold mode, and redistributing charge stored on the second reference capacitor and the second input capacitor during the hold mode, such that the common-mode input voltage of the differential amplifier is determined by the redistribution of charges.

In another example, an apparatus for regulating a common-mode input voltage for a differential amplifier in a switched capacitor circuit is described below. The apparatus includes a first means for initializing that is arranged to initialize first and second reference capacitors to a first potential during a sampling mode. A first means for selectively coupling is arranged to selectively couple one of a first reference signal and a second reference signal to the first capacitor, and to selectively couple the other of the first and second reference signals to the second reference capacitor, during a hold mode. A second means for initializing is arranged to initialize first and second input capacitors to a second potential during the sampling mode. A second means for selectively coupling is arranged to couple the first reference capacitor and the first input capacitor to a first input of the differential amplifier during the hold mode. Charges on the first reference capacitor and the first input capacitor are redistributed. A third means for selectively coupling is arranged to couple the second reference capacitor and the second input capacitor to a second input of the differential amplifier during the hold mode. Charges on the second reference capacitor and the second input capacitor are redistributed. The redistribution of charges on the reference capacitors and the input capacitors are utilized to adjust the common-mode input voltage of the differential amplifier.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal, electromagnetic wave signal, or data signal. The meaning of "a", "an", and "the" include plural references. The meaning of "in" includes "in" and "on".

The present invention generally relates to switched capacitor circuits. Switched capacitor circuits are often used in delta-sigma modulator (ΔΣ-modulator) type analog-to-digital converters (ADC) as integrator circuits. The present invention allows a switched capacitor integrator circuit to operate with a minimum number of reference voltages such that the overall system design is simplified. Costs are reduced since fewer reference circuits are required by the system. Also, the common-mode input voltage of the amplifiers in the improved design allow the amplifiers to work on at very low power supply levels on the order of 1.8V.

The operating environment for the switched capacitor integrator circuit is described below with reference to FIG. 1.

Operating Environment

Figure 1:
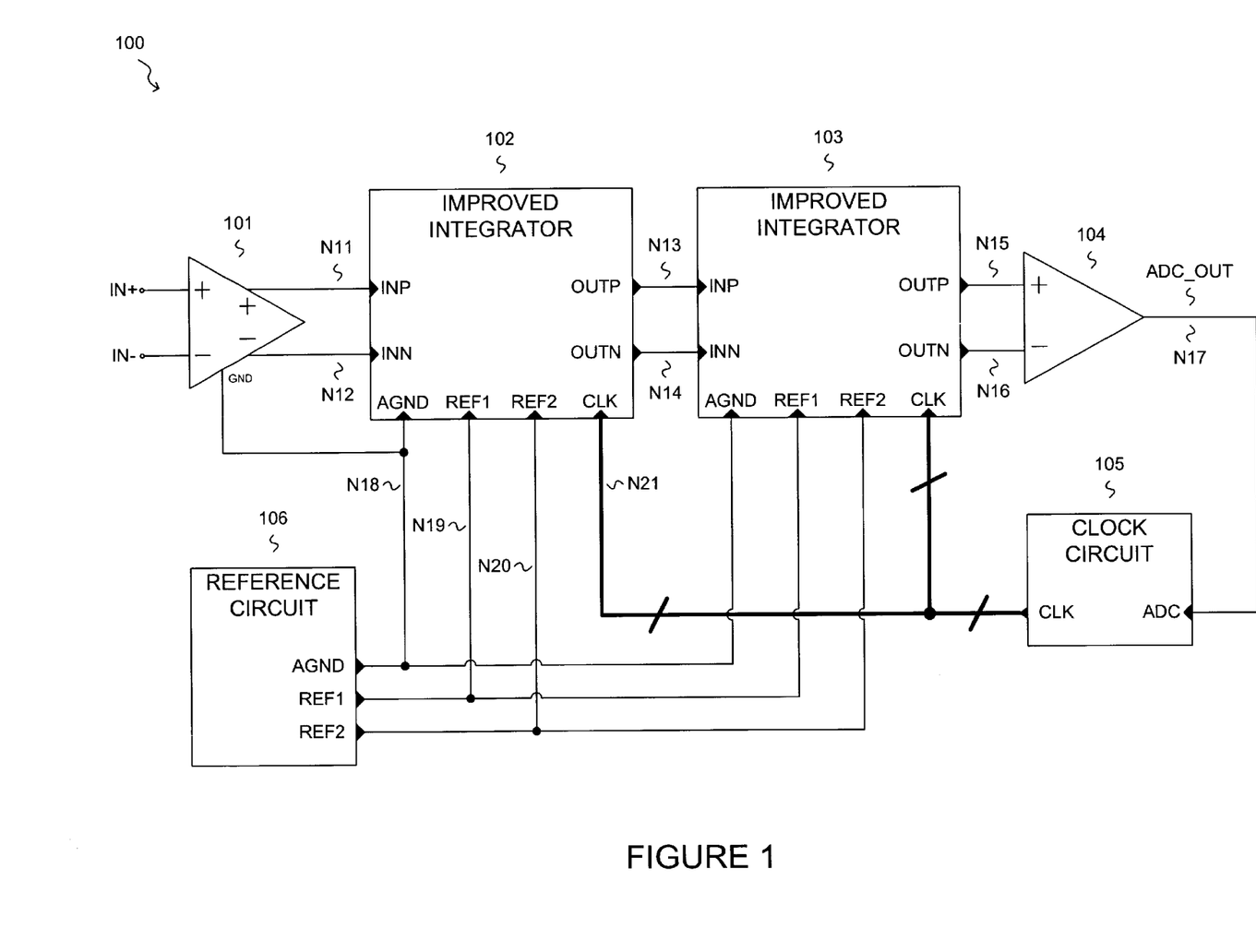
FIG. 1 is a schematic diagram illustrating an exemplary operating environment.

FIG. 1 is a schematic diagram illustrating a switched capacitor based ΔΣ-modulator ADC (100) that is in accordance with the present invention. The ΔΣ-modulator ADC (100) includes a differential amplifier circuit (101), two improved integrator circuits (102, 103), a comparator circuit (104), a clock circuit (105), and a reference circuit (106). This ΔΣ-modulator ADC (100) is depicted as a second order system since it has two stages of integration.

The reference circuit (106) provides an analog ground signal (AGND), and two reference signals (REF1, REF2) to nodes N18, N19, and N20 respectively. The clock circuit (105) provides a bus of clocking signals (CLK) to node N21. The output of the comparator (ADC_OUT) provides a single bit output (ADC_OUT) to node N17 that is fed-back to the clock circuit (105).

In operation, a differential input signal is received by the differential amplifier (101) across the IN+ and IN− terminals. The differential amplifier (101) buffers this differential input signal and provides a first differential signal across nodes N11 and N12. The differential amplifier (101) is arranged to adjust the DC voltage levels of the first differential signal is centered about AGND. The first differential signal is applied to the INP and INN inputs of the first improved integrator (102). The output (OUTP, OUTN) of the first improved integrator (102) is a second differential signal that is applied across nodes N13 and N14, where it is received by the INP and INN inputs of the second improved integrator (103). The second improved integrator (103) produces a third differential signal across nodes N15 and N16 in response to the second differential signal. The comparator circuit (104) is arranged to produce a one-bit output (ADC_OUT) at node N17 in response to the third differential signal.

The improved integrator circuits (102, 103) share common clocking signals (CLK), an analog ground (AGND), and the two reference signals (REF1, REF2). The present invention exploits the properties of switched capacitor circuits by proper arrangement of the reference signals (REF1, REF2), the analog ground signal (AGND), and the clocking signals (CLK) in the improved integrators (102, 103).

As will be discussed with reference to FIGS. 2–5, the clock circuit is arranged to provide clocking signals that are used by the improved integrator circuits. The clocking signals are arranged such that the integrators have a sampling phase and a hold phase. In the sampling phase, the improved integrators sample the differential that is received at its input (i.e., INP, INN). During the hold phase, the integrators provide an integration of the sampled input signal. The integrators will either integrate in a positive (or increasing) direction, or in a negative (or decreasing) direction based on the output of the comparator (ADC_OUT).

Figure 2:
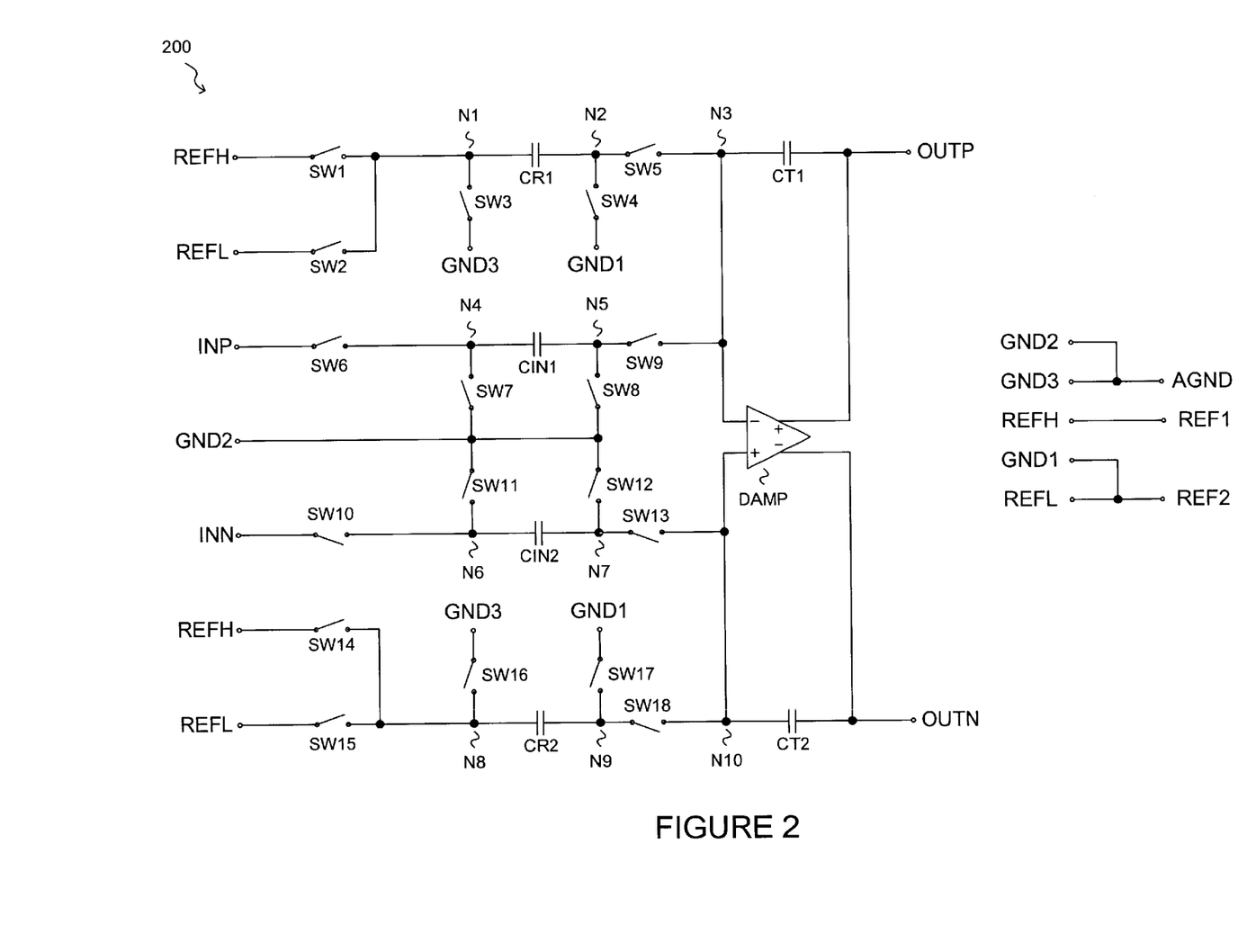
FIG. 2 is a schematic diagram illustrating a first embodiment.

An overview of an exemplary switched capacitor integrator circuit that is in accordance with the present invention is illustrated in FIG. 2.

Overview of the Improved Integrator

FIG. 2 is a schematic diagram of an improved integrator (200) that is in accordance with the present invention. The improved integrator (200) includes a differential amplifier (DAMP), six capacitors (CR1, CR2, CIN1, CIN2, CT1, CT2), and eighteen switches (SW1–SW18). The circuit further includes a differential input (INP, INN), a differential output (OUTP, OUTN), three ground signals (GND1, GND2, GND3), and two reference signals (REFH, REFL).

Switch SW1 is coupled between REFH and node N1. Switch SW2 is coupled between REFL and node N1. Switch SW3 is coupled between GND3 and node N1. Switch SW4 is coupled between node N2 and GND1. Switch SW5 is coupled between node N2 and node N3. Switch SW6 is coupled between INP and node N4. Switch SW7 is coupled between node N4 and GND2. Switch SW8 is coupled between node N5 and GND2. Switch SW9 is coupled between node N5 and node N3. Switch SW10 is couple between INN and node N6. Switch SW11 is coupled between node N6 and GND2. Switch SW12 is coupled between node N7 and GND2. Switch SW13 is coupled between node N7 and node N10. Switch SW14 is coupled between REFH and node N8. Switch SW15 is coupled between REFL and node N8. Switch SW16 is coupled between node N8 and GND3. Switch SW17 is coupled between node N9 and GND1. Switch SW18 is coupled between node N9 and node N10. The switches (SW1–SW18) are controlled by various clock signals that are not illustrated, but will be described with respect to the operation illustrated in FIGS. 3–5.

Differential amplifier DAMP has an inverting input that is coupled to node N3, a non-inverting input that is coupled to node N10, and a differential output that is provided across OUTP and OUTN. Capacitor CR1 is coupled between node N1 and node N2. Capacitor CR2 is coupled between node N8 and node N9. Capacitor CIN1 is coupled between node N4 and node N5. Capacitor CIN2 is coupled between node N6 and node N7. Capacitor CT1 is coupled between node N3 and OUTP. Capacitor CT2 is coupled between node N10 and OUTN.

The capacitors illustrated in FIG. 2 may be integrated "on-chip" instead of being provided to the circuit as external components. Thus, manufacturing and production costs associated with the electronic system may be further reduced. The capacitors may also be replaced by one or more capacitors that are arranged in parallel, and/or in series, or some other circuit arrangement that is arranged to provide a capacitive function.

Although the circuit illustrated in FIG. 2 depicts single switches, the arrangement is not so limited. Any electronic circuit that is arranged to provide a controlled switching function such as, for example, a transmission gate or may replace the individual switches may replace the switches.

In operation, GND1, GND2, GND3, REFH, and REFL are coupled to only three distinct signals (AGND, REF1, and REF2) instead of five signals. By reducing the total number of signals required by the switched capacitor circuit, fewer electronic reference circuits are required and the overall cost of the circuit is reduced.

By carefully choosing the reference and ground signals the input common-mode voltage to the differential amplifier (DAMP) is optimized. By maintaining a relatively constant input common-mode voltage, the amplifier may be configured to operate at very low power supplies that have been unattainable in conventional designs.

In one example, as shown in FIG. 2, GND2, and GND3 are commonly connected to AGND, GND1 and REFL are commonly connected to REF2, while REFH is connected to REF1. In another example (not shown), GND1 and REFL are commonly connected to REF2, GND2 is connected to AGND, and GND3 and REFH are commonly connected to REF1.

In one example of the present invention, the improved integrator circuit is powered with supply voltages of +1.8V and 0.0V. In this example, the reference signals may be derived as GND2=GND3=0.9V, REFH=1.2V, and GND1= REFL=0.0V. The 1.2V reference signal is easily derived from a band-gap type reference generator. The 0.9V reference is easily derived from half supply circuit such as a resistor divider a resistor divider or alternatively from a band-gap type reference generator, while the 0V reference is simply ground. In other implementations where a regulated high power supply voltage is provided, the 1.2V reference circuit may be replaced by a connection to the high power supply voltage. As will be discussed later, appropriately arranging the connections of three reference signals to the capacitors and scaling the capacitor ratios can be used to adjust the common-mode voltage.

The circuit illustrated in FIG. 2 has three operating modes: a sample mode, a high hold mode, and a low hold mode. In operation, the sample mode is activated before either of the hold modes. The high hold mode is activated after the sample mode when the output (ADC_OUT) of the comparator (104) illustrated in FIG. 1 is high, while the low hold mode is activated after the sample mode when the output (ADC_OUT) of the comparator (104) in FIG. 1 is low.

The operating modes for the improved integrator circuit (200) will be discussed in further detail below with reference to FIGS. 3–5.

Sample Mode Operation

Figure 3:
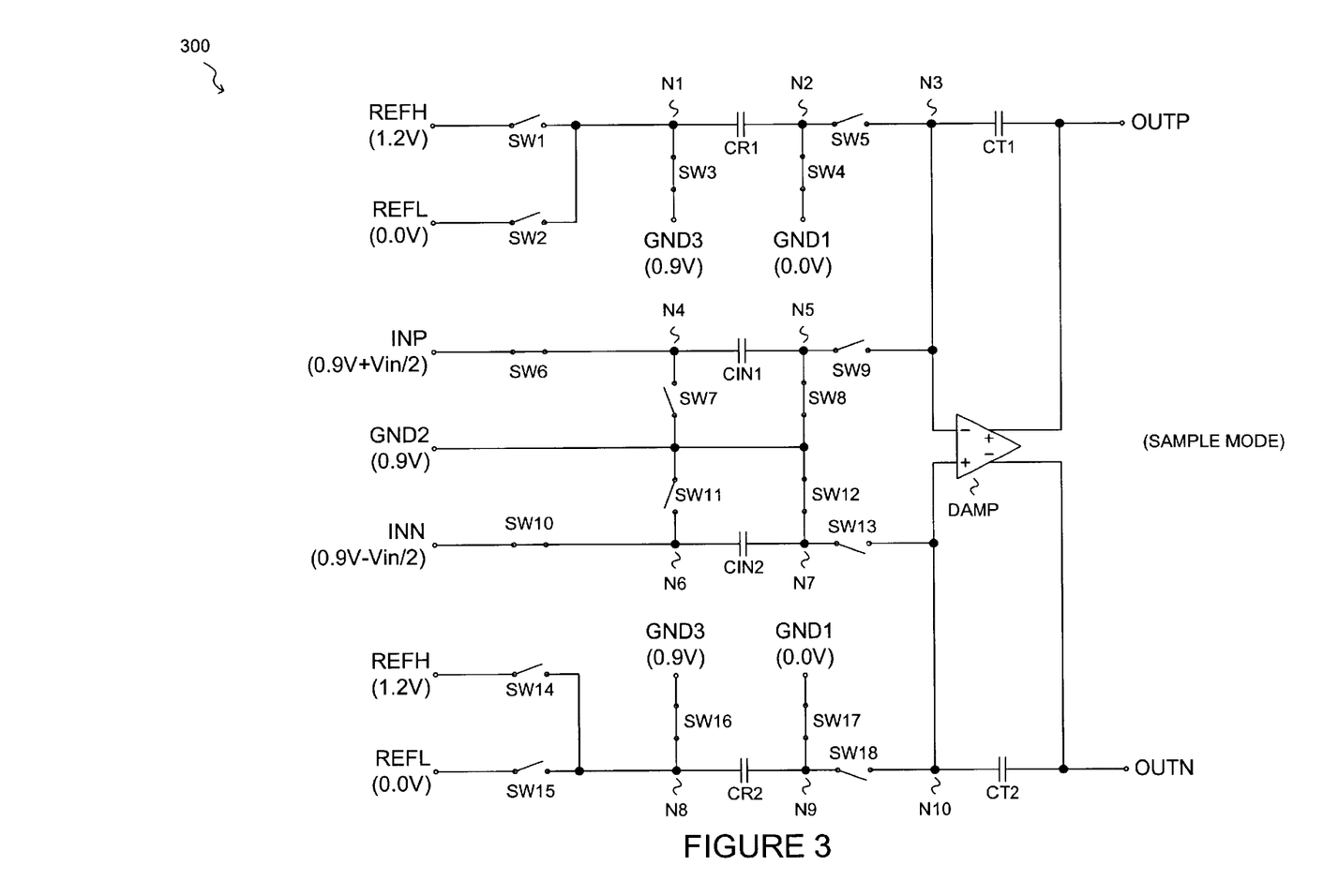
FIG. 3 is a schematic diagram illustrating the sampling mode operation of the embodiment shown in FIG. 2.

The sampling mode operation of the improved integrator circuit is illustrated in FIG. 3. As shown in the figure, switches SW3, SW4, SW6, SW8, SW10, SW12, SW16, and SW17 are closed, while the remaining switches are open.

While switches SW3 and SW4 are closed, capacitor CR1 is charged to a first potential that is determined by GND1 and GND3. Similarly, while switches SW16 and SW17 are closed, capacitor CR2 is charged to the first potential that is determined by GND1 and GND3. The amount of charge stored in capacitors CR1 and CR2 are determined by their sizes (charge (Q)=CV). When CR1 and CR2 are equally sized, the amount of charge stored therein is also equal. Capacitor CR1 is effectively initialized to the first potential during the sample mode, where the first potential between nodes N1 and N2 corresponds to GND3−GND1. Similarly, capacitor CR2 is initialized to the first potential during the sample mode, where the potential between nodes N8 and N9 also corresponds to GND3−GND1 (the first potential).

Capacitor CIN1 is charged to a second potential that is determined by the potential at INP and GND2, while switches SW6 and SW8 are closed. Similarly, capacitor CIN2 is charged to a third potential that is determined by the potential at INN and GND2, while switches SW10 and SW12 are closed. Capacitors CIN1 and CIN2 operate as a differential sampling circuit that stores a differential signal (Vin) during the sample mode.

In operation, a differential signal (Vin) is applied across the INP and INN terminals. The differential signal (Vin) has a DC voltage level that is the same as GND2. For example, 0.9V+Vin/2 is applied to the INP terminal and 0.9V-Vin/2 is applied to the INN terminal when GND2 is set to 0.9V. In this example, Vin is differentially applied across the INP and INN terminals with a DC voltage level of 0.9V.

High Hold Mode Operation

Figure 4:
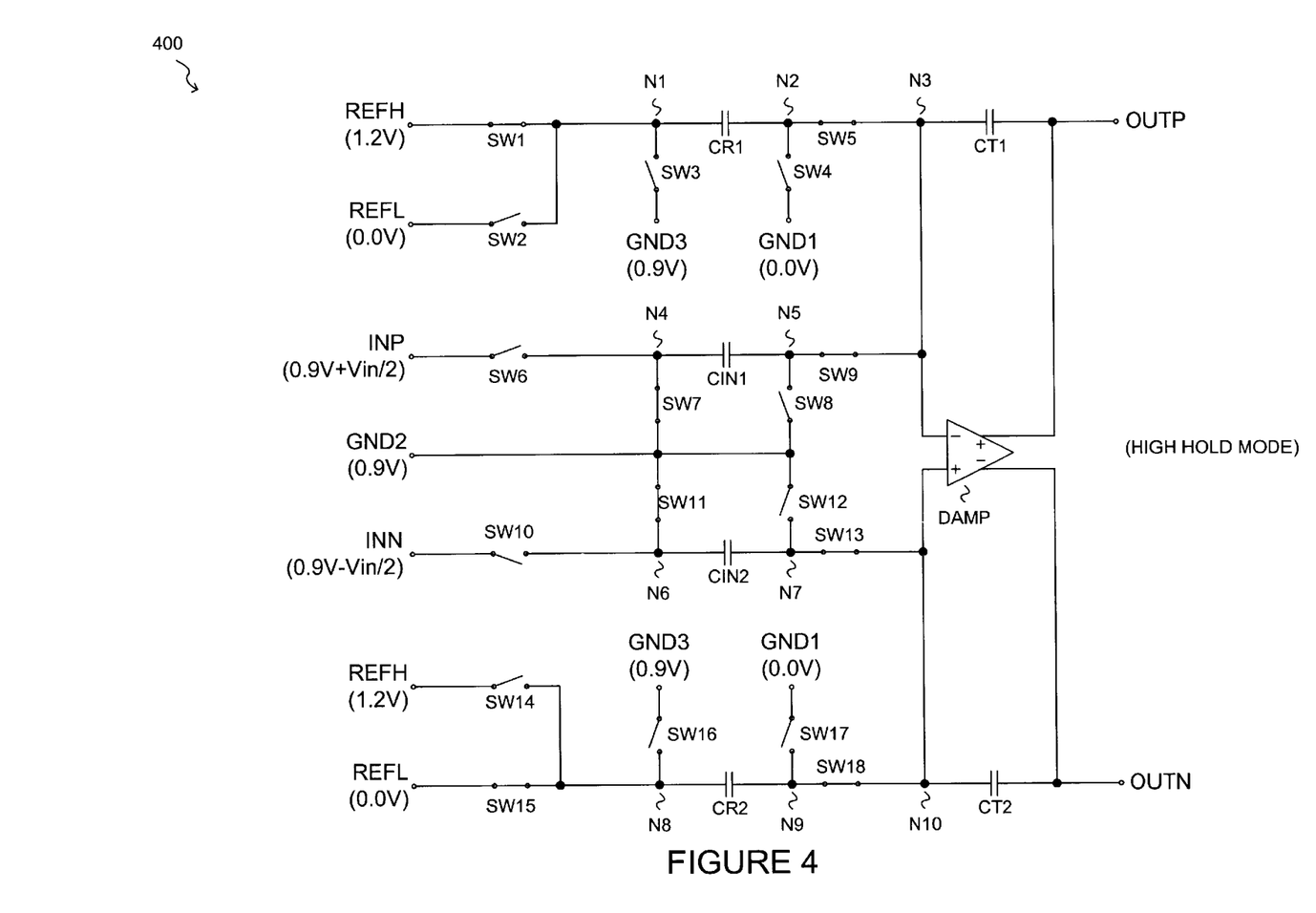
FIG. 4 is a schematic diagram illustrating the high hold mode operation of the embodiment shown in FIG. 2.

The high hold mode operation of the improved integrator circuit is illustrated in FIG. 4. As shown in the figure, switches SW1, SW5, SW7, SW9, SW11, SW13, SW15, and SW18 are closed, while the remaining switches are open. The high hold mode is activated when the output of the comparator (e.g., comparator 104 in FIG. 1) is high (i.e., logic "1").

During the high hold mode, differential amplifier DAMP and capacitor CT1 operate as an integrator. Nodes N3 operates as virtual ground node with respect to capacitors CR1, CIN1 and CT1. The charges that were stored on capacitors CR1 and CIN1 during the sampling mode are transferred to CT1. Similarly, differential amplifier DAMP and capacitor CT2 operate as an integrator. Node N10 operates as a virtual ground with respect to capacitors CR2, CIN2, and CT2. The charges that were stored on capacitors CR2 and CIN2 during the sampling mode are transferred to CT2.

While switches SW1 and SW5 are closed, reference signal REFH is coupled to one plate of capacitor CR1 at node N1. The charge that was previously stored on capacitor CR1 in the sampling phase (GND3–GND1) is maintained such that the potential on the other plate at node N2 is determined by REFH–GND3+GND1. Similarly, reference signal REFL is coupled to one plate of capacitor CR2 at node N8 when switches SW15 and SW18 are closed. The charge that was previously stored on capacitor CR2 in the sampling phase (GND3–GND1) is maintained such that the potential on the other plate of capacitor CR2 at node N9 is determined by REFL–GND3+GND1. Thus, charge is transferred from capacitor CR1 to capacitor CT1, and from capacitor CR2 to capacitor CT2, respectively.

Low Hold Mode Operation

Figure 5:
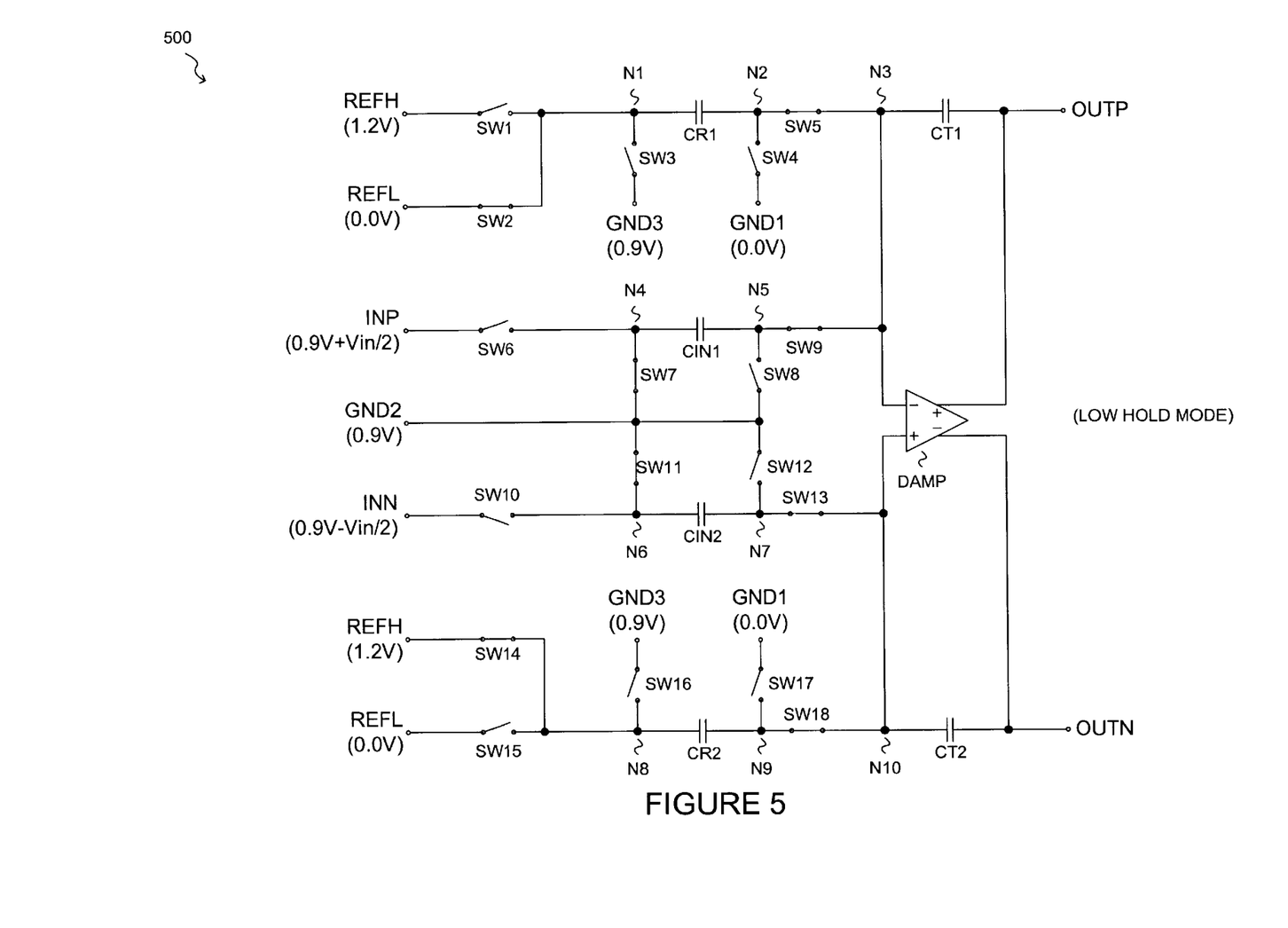
FIG. 5 is a schematic diagram illustrating the low hold mode operation of the embodiment shown in FIG. 2, in accordance with the present invention.

The low hold mode operation of the improved integrator circuit is illustrated in FIG. 5. As shown in the figure, switches SW2, SW5, SW7, SW9, SW11, SW13, SW14, and SW18 are closed, while the remaining switches are open. The low hold mode is activated when the output of the comparator (e.g., comparator 104 in FIG. 1) is low (i.e., logic "0").

The analysis of the low hold mode is substantially the same as the high hold mode. However, in the low hold mode, REFL is coupled to capacitor CR1 while REFH is coupled to capacitor CR2. Thus, the integrator circuit (500) is arranged to integrate in the opposite direction with respect to the integrator circuit (400) illustrated in FIG. 4.

The common-mode input voltage (VCM) of differential amplifier DAMP will be analyzed below with reference to the sample mode and high hold mode previously discussed.

Analysis of Common-mode Input Voltage

The voltage across capacitor CR1 at nodes N1 and N2 during the high hold mode is given by: VCR1=GND3–GND1. Since CR1 is coupled to REFH at node N1, the voltage at virtual ground node N3 is given by:

$$VN3 = REFH - GND3 + GND1 \quad (EQ1)$$

Similarly, the voltage across capacitor CR2 at nodes N8 and N9 during the high hold mode is given by: VCR2=GND3–GND1. Since CR2 is coupled to REFL at node N8, the voltage at virtual ground node N10 is given by:

$$VN10 = REFL - GND3 + GND1 \quad (EQ2)$$

The reference voltages are given by:

$$REFH = \left(\frac{REFH + REFL}{2}\right) + \left(\frac{REFH - REFL}{2}\right) \quad (EQ3)$$

$$REFL = \left(\frac{REFH + REFL}{2}\right) - \left(\frac{REFH - REFL}{2}\right) \quad (EQ4)$$

Substituting EQ3 into EQ1, and EQ4 into EQ2 yields:

$$VN3 = \left(\frac{REFH + REFL}{2}\right) + \left(\frac{REFH - REFL}{2}\right) - GND3 + GND1 \quad (EQ5)$$

$$VN10 = \left(\frac{REFH + REFL}{2}\right) - \left(\frac{REFH - REFL}{2}\right) - GND3 + GND1 \quad (EQ6)$$

By inspection of EQ5 and EQ6, it is observed that the voltages at nodes N3 and N10 have a common term and a differential term. The common-mode term is given by:

$$VCMR = \left(\frac{REFH + REFL}{2}\right) - GND3 + GND1 \quad (EQ7)$$

EQ7 can also be expressed as:

$$VCMR = GND2 + \Delta VCMR \quad (EQ8)$$

Where:

$$\Delta VCMR = -GND2 - GND3 + GND1 + \left(\frac{REFH + REFL}{2}\right) \quad (EQ9)$$

The difference in common-mode voltages between capacitors CR1 and CR2 and capacitors CIN1 and CIN2 is shared during the hold mode (integration mode). Typically, the capacitors illustrated in FIGS. 2–5 will be matched in pairs. For example, capacitors CR1 and CR2 will typically have matched values corresponding to CR, while capacitors CIN1, CIN2 and CT1 and CT2 will have matched values corresponding to CIN and CT respectively.

Using matched pairs of capacitors, the input common-mode of the amplifier is calculated as follows:

$$\Delta VCM*(CR+CIN) = \Delta VCMR*CR \quad (EQ10)$$

$$\Delta VCM = \frac{\Delta VCMR * CR}{(CR + CIN)} \quad (EQ11)$$

$$VCM = GND2 + \Delta VCM \quad (EQ12)$$

Combining EQ11 and EQ12 yields:

$$VCM = GND2 + \Delta VCMR * \frac{CR}{(CR + CIN)} \quad (EQ13)$$

By combining EQ9 and EQ13, the final equation for the common-mode input voltage of the amplifier is determined:

$$VCM = GND2 + \left(GND1 - GND2 - GND3 + \left(\frac{REFH + REFL}{2}\right)\right) * \frac{CR}{(CR + CIN)}$$

By choosing GND1, GND2, GND3, REFH, and REFL, the common mode voltage is defined. As can be observed in the above equation, the ratio of the capacitor values for CR and CIN will scale the common-mode voltage for any given set of reference signals.

Exemplary Integrator Common-mode Voltage

An example integrator circuit is realized with three reference signals (AGND, REF1, REF2) as illustrated in FIG. 2. As shown in FIG. 2, GND2, and GND3 are commonly connected to AGND, GND1 and REFL are commonly connected to REF2, while REFH is connected to REF1. When CR=CIN, the common-mode voltage (VCM) can be determined as:

$$VCM = \frac{1}{4}REF1 + \frac{3}{4}REF2$$

In this example, when REF1=1.2V and REF2=0V, VCM=0.3V.

In another example, GND1 and REFL are commonly connected to REF2, GND2 is connected to AGND, and GND3 and REFH are commonly connected to REF1. When AGND=0.9V, REF1=1.2V, and REF2=0.0V, CIN=2*CR, the resulting common-mode input voltage is VCM=0.4V.

In light of the above description and the accompanying figures, it is understood and appreciated that the common-mode input voltage in the switched capacitor circuit can be adjusted as is desired for any particular differential amplifier (i.e., DAMP in FIGS. 2–5). For example, a typical PMOS transistor has a threshold potential of roughly −1V. As such, the gate of the PMOS device needs to be biased to a potential that is well below the highest power supply voltage by at least the threshold potential. For a PMOS-type differential amplifier that is operating on a 1.8V power supply, the common-mode voltage should be at least below 0.8V for the amplifier to properly work. For maximum input signal swing, the common-mode of the PMOS differential amplifier should be centered at about 0.4V. Similarly for an NMOS differential amplifier with a process threshold that is roughly +1V, the common-mode input voltage should be centered about +1.4V with a 1.8V power supply. By using the above described design techniques, the common-mode input voltage of the differential amplifier can be adjusted for optimum performance with low power supply voltages.

Although the preceding description describes various embodiments of the system, the invention is not limited to such embodiments, but rather covers all modifications, alternatives, and equivalents that fall within the spirit and scope of the invention. Since many embodiments of the invention can be made without departing from the spirit and scope of the invention, the invention resides in the claims hereinafter appended.

I claim:

1. An apparatus for controlling a common-mode input voltage for a differential amplifier, wherein the differential amplifier includes a first input terminal and a second input terminal, the apparatus comprising:

a first and second reference capacitance circuit;

a first and second input capacitance circuit;

a first and second switching circuit that are arranged to initialize the first and second reference capacitance circuits, respectively, to a first potential when the apparatus is in a sample mode;

a third and fourth switching circuit that are arranged to initialize the first and second input capacitance circuits, respectively, to a second potential when the apparatus is in the sample mode;

a fifth switching circuit that is arranged to couple a first reference signal to the first reference capacitance circuit when the apparatus is in a hold mode;

a sixth switching circuit that is arranged to couple a second reference signal to the second reference capacitance circuit when the apparatus is in the hold mode;

a seventh switching circuit that is arranged to couple the first reference capacitance circuit and the first input capacitance circuit to the first input of the differential amplifier when the apparatus is in the hold mode; and an eighth switching circuit that is arranged to couple the second reference capacitance circuit and the second input capacitance circuit to the second input of the differential amplifier when the apparatus is in the hold mode, such that the common-mode input voltage of the differential amplifier is determined by at least the first reference signal, the second reference signal, and a third reference signal, wherein the first potential is determined by two of the first, second, and third reference signals, and the second potential is determined by at least one of the first, second, and third reference signals.

2. An apparatus as in claim 1, further comprising a scaling factor, wherein the common-mode input voltage of the differential amplifier is scalable by adjusting the scaling factor.

3. An apparatus as in claim 1, wherein the scaling factor is determined by a ratio of capacitance values associated with the first reference capacitance circuit and the first input capacitance circuit.

4. An apparatus as in claim 1, wherein the first reference capacitance circuit is substantially matched to the second reference capacitance circuit, and the first input capacitance circuit is substantially matched to the second input capacitance circuit.

5. An apparatus as in claim 1, wherein the first potential is determined by the second and third reference signals, and the second potential is determined by the third reference signal.

6. An apparatus as in claim 1, wherein the first reference capacitor is selectively coupled to second and third reference signals when the apparatus is in the sample mode such that the first potential corresponds to a difference between potentials associated with the second and third reference signals.

7. An apparatus as in claim 1, wherein the second reference signal corresponds to a negative power supply voltage, and the third reference signal corresponds to an analog ground that is halfway between a positive power supply voltage and the negative power supply voltage.

8. An apparatus as in claim 1, wherein the first reference signal corresponds to at least one of a band-gap reference voltage and the positive power supply voltage.

9. An apparatus as in claim 1, wherein the first potential is determined by the first and second reference signals, and the second potential is determined by the third reference signal.

10. An apparatus as in claim 1, wherein the first reference capacitor is selectively coupled to first and second reference signals when the apparatus is in the sample mode such that the first potential corresponds to a difference between potentials associated with the first and second reference signals.

11. An apparatus as in claim 1, wherein the third and fourth switching circuits are also arranged to couple a differential input signal across the first and second input capacitance circuits such that the differential input signal is sampled when the apparatus is in the sample mode.

12. An apparatus as in claim 11, wherein the differential amplifier is configured to operate as a delayed integrator when the apparatus is in the hold mode.

13. An apparatus as in claim 1, wherein the third and fourth switching circuits are also arranged to couple a differential input signal across the first and second input capacitance circuits such that the differential input signal is sampled when the apparatus is in the hold mode.

14. An apparatus as in claim 13, wherein the differential amplifier is configured to operate as a non-delayed integrator when the apparatus is in the hold mode.

15. An apparatus as in claim 1, further comprising a first feedback capacitor and a second feedback capacitor, wherein the first feedback capacitor is coupled between a first output of the differential amplifier and the first input of the differential amplifier, and the second feedback capacitor is coupled between a second output of the differential amplifier and the second input of the differential amplifier.

16. An apparatus as in claim 15, wherein the switching circuits, the differential amplifier, and the first and second feedback capacitors are arranged to operate as one of a delayed differential integrator circuit and a non-delayed differential integrator circuit.

17. An apparatus as in claim 1, wherein the differential amplifier has a PMOS input stage and the common-mode voltage of the differential amplifier is substantially centered halfway between a negative power supply voltage and a predetermined voltage below the positive power supply voltage such that the differential amplifier operates as a linear amplifier.

18. An apparatus as in claim 17, wherein the predetermined voltage corresponds to a threshold potential for a PMOS transistor.

19. An apparatus as in claim 1, wherein the differential amplifier has an NMOS input stage and the common-mode voltage of the differential amplifier is substantially centered halfway between a positive power supply voltage and a predetermined voltage above the negative power supply voltage such that the differential amplifier operates as a linear amplifier.

20. An apparatus as in claim 19, wherein the predetermined voltage corresponds to a threshold potential for a NMOS transistor.

21. An apparatus as in claim 1, wherein the common-mode input voltage is arranged such that the differential amplifier operates as a linear amplifier when a difference between the positive power supply voltage and the negative power supply voltage is below 2V.

22. A method of controlling a common-mode input voltage for a differential amplifier in a switched capacitor circuit, comprising:

initializing first and second reference capacitors to a first potential during a sampling mode;

coupling one of a first reference signal and a second reference signal to the first reference capacitor during a hold mode;

coupling another of the first reference signal and a second reference signal to the second reference capacitor during the hold mode;

initializing first and second input capacitors to a second potential during the sampling mode;

coupling the first reference capacitor and the first input capacitor to a first input of the differential amplifier during the hold mode;

coupling the second reference capacitor and the second input capacitor to a second input of the differential amplifier during the hold mode;

redistributing charge stored on the first reference capacitor and the first input capacitor during the hold mode; and redistributing charge stored on the second reference capacitor and the second input capacitor during the hold mode, such that the common-mode input voltage of the differential amplifier is determined by the redistribution of charges.

23. An apparatus for regulating a common-mode input voltage for a differential amplifier in a switched capacitor circuit, comprising:

a first means for initializing that is arranged to initialize first and second reference capacitors to a first potential during a sampling mode;

a first means for selectively coupling that is arranged to selectively couple one of a first reference signal and a second reference signal to the first capacitor, and to selectively couple the other of the first and second reference signals to the second reference capacitor, during a hold mode;

a second means for initializing that is arranged to initialize first and second input capacitors to a second potential during the sampling mode;

a second means for selectively coupling that is arranged to couple the first reference capacitor and the first input capacitor to a first input of the differential amplifier during the hold mode, such that charges on the first input capacitor and the first input capacitor are redistributed; and a third means for selectively coupling that is arranged to couple the second reference capacitor and the second input capacitor to a second input of the differential amplifier during the hold mode, such that charges on the second reference capacitor and the second input capacitor are redistributed, wherein the redistribution of charges on the reference capacitors and the input capacitors adjusts the common-mode input voltage of the differential amplifier.

* * * * *